US010008667B2

(12) United States Patent
Fumagalli et al.

(10) Patent No.: US 10,008,667 B2
(45) Date of Patent: Jun. 26, 2018

(54) MATERIALS AND COMPONENTS IN PHASE CHANGE MEMORY DEVICES

(71) Applicant: Intel Corporation, Santa Clara, CA (US)

(72) Inventors: Luca Fumagalli, Milan (IT); Carla M. Lazzari, Casatenovo (IT); Valter Soncini, Sesto san Giovanni (IT)

(73) Assignee: Intel Corporation, Santa Clara, CA (US)

( * ) Notice: Subject to any disclaimer, the term of this patent is extended or adjusted under 35 U.S.C. 154(b) by 0 days. days.

(21) Appl. No.: 14/473,371

(22) Filed: Aug. 29, 2014

(65) Prior Publication Data

US 2016/0064665 A1    Mar. 3, 2016

(51) Int. Cl.
*H01L 45/00* (2006.01)
*H01L 27/24* (2006.01)

(52) U.S. Cl.
CPC ...... *H01L 45/1253* (2013.01); *H01L 27/2427* (2013.01); *H01L 45/06* (2013.01); *H01L 45/128* (2013.01); *H01L 45/1233* (2013.01); *H01L 45/144* (2013.01); *H01L 45/148* (2013.01); *H01L 45/16* (2013.01)

(58) Field of Classification Search
CPC ... H01L 45/06; H01L 45/1233; H01L 45/148; H01L 45/144
USPC .................. 365/100; 438/477, 149; 257/4
See application file for complete search history.

(56) References Cited

U.S. PATENT DOCUMENTS

| 2004/0208038 | A1* | 10/2004 | Idehara | G11C 13/0004 |
| | | | | 365/100 |
| 2005/0087268 | A1* | 4/2005 | Chu | C22C 9/00 |
| | | | | 148/518 |
| 2006/0043354 | A1 | 3/2006 | Pinnow et al. | |
| 2008/0191188 | A1 | 8/2008 | Jeong | |
| 2008/0233388 | A1* | 9/2008 | Morita | C23C 14/06 |
| | | | | 428/336 |
| 2008/0237566 | A1 | 10/2008 | An et al. | |
| 2009/0032794 | A1* | 2/2009 | Hsiao | H01L 45/06 |
| | | | | 257/4 |
| 2009/0219755 | A1 | 9/2009 | Zaidi | |
| 2009/0267803 | A1* | 10/2009 | Tominaga | G01D 5/34707 |
| | | | | 341/13 |
| 2012/0305522 | A1* | 12/2012 | Park | H01L 45/06 |
| | | | | 216/13 |
| 2013/0048935 | A1 | 2/2013 | Gotti et al. | |
| 2013/0292631 | A1* | 11/2013 | Chin | H01L 45/06 |
| | | | | 257/4 |
| 2013/0319848 | A1* | 12/2013 | Neidhardt | C23C 14/3414 |
| | | | | 204/192.12 |
| 2014/0127851 | A1* | 5/2014 | Yamamoto | H01L 21/02485 |
| | | | | 438/95 |

(Continued)

FOREIGN PATENT DOCUMENTS

JP        2006/117997 A    5/2006

*Primary Examiner* — Bo Fan
(74) *Attorney, Agent, or Firm* — Thorpe North and Western, LLP; David W. Osborne

(57) ABSTRACT

Phase change memory cells, structures, and devices having a phase change material and an electrode forming an ohmic contact therewith which includes carbon and tungsten doped with nitrogen are disclosed and described. Such electrodes have a low contact resistance with the phase change material and a high thermal stability from room temperature to temperatures needed for programming operations.

15 Claims, 4 Drawing Sheets

(56) References Cited

U.S. PATENT DOCUMENTS

2014/0141318 A1* 5/2014 Lee ..................... H01M 4/386
                                                    429/177
2014/0234616 A1   8/2014 Hultman et al.

* cited by examiner

MATERIALS AND COMPONENTS IN PHASE CHANGE MEMORY DEVICES

BACKGROUND

Phase change memory is a type of non-volatile random-access memory that utilizes a detectable change in the physical state of a material as an information storage medium. For example, the phase change of a material from an amorphous state to a crystalline state or vice versa can be induced and then detected in order to store and then retrieve information. As a simplified example, a chalcogenide material can be heated and cooled in a manner that solidifies the material in an amorphous state, or the chalcogenide heated and cooled in a manner that solidifies the material in a crystalline state. Other specific heating and cooling protocols may be employed to result in solidification of the calcogenide material at different specific degrees of crystallinity across the spectrum between completely amorphous and completely crystalline states.

Once solidified, the phase change material is non-volatile. The phase change material state, whether solidified to a crystalline, semi-crystalline, amorphous, or semi-amorphous state, is thus retained until reprogrammed. This is due to the fact that, once solidified, the state of the material is not dependent upon electrical power.

DESCRIPTION OF EMBODIMENTS

Figure 1:
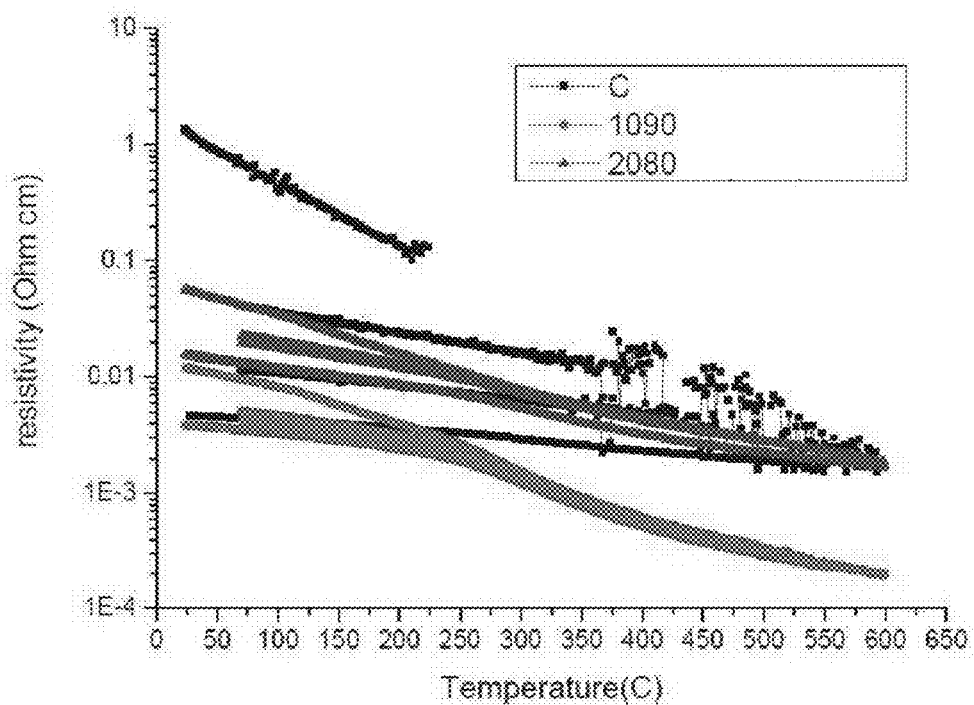
FIG. 1 is a graphical representation of data in accordance with an invention embodiment.

Although the following detailed description contains many specifics for the purpose of illustration, a person of ordinary skill in the art will appreciate that many variations and alterations to the following details can be made and are considered to be included herein.

Accordingly, the following embodiments are set forth without any loss of generality to, and without imposing limitations upon, any claims set forth. It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this specification and the appended claims, the singular forms "a," "an" and "the" include plural referents unless the context clearly dictates otherwise. Thus, for example, reference to "a layer" includes a plurality of such layers.

In this disclosure, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open ended term, like "comprising" or "including," it is understood that direct support should be afforded also to "consisting essentially of" language as well as "consisting of" language as if stated explicitly and vice versa.

"The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein. The term "coupled," as used herein, is defined as directly or indirectly connected in an electrical or nonelectrical manner. Objects or structures described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, "a select device material" can refer to a number of materials acceptable for use in a phase change memory structure or device, and may be determined by the required function or desired properties thereof. In one example, a select device material may be a phase change material. Such material may be the same as, similar to, or different than, a phase change material of a cell used to record and store information. In another aspect, such material may be a conductor, semiconductor, or dielectric material. Such materials may be selected as needed to perform an intended function for its location in the device.

As used herein, "enhanced," "improved," "performance-enhanced," "upgraded," and the like, when used in connection with the description of a device or process, refers to a characteristic of the device or process that provides measurably better form or function as compared to previously known devices or processes. This applies both to the form and function of individual components in a device or process, as well as to such devices or processes as a whole.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free" of particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. However, it is to be understood that even when the term "about" is used in the present specification in connection with a specific numerical value, that support for the exact numerical value recited apart from the "about" terminology is also provided.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

As used herein, numerical values as applied to the content of C, W, or N in an electrode, including numerical values relative to one another, such as ratios, can be considered to be measured in atomic % (i.e. at %).

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific technology embodiments are then described in further detail. This initial summary is intended to aid readers in understanding the technology more quickly but is not intended to identify key or essential technological features, nor is it intended to limit the scope of the claimed subject matter.

Phase change memory cells or structures typically include a number of components in order to operate. For example, a material that changes and holds a phase under induced conditions, electrodes that provide electrical access to the phase change material, and dielectric layers insulating between phase change materials are all typical phase change memory components. It can be beneficial for electrodes that contact phase change materials, for example chalcogenide materials to have certain properties across all, or substantially all, of the desired range of operating temperatures. Such temperatures can range, for example, from about room temperature to the melting point of the phase change material, which can be about 600° C. As such, the selection of an electrode material can greatly affect the performance of such a memory cell or structure, and thus the performance of a memory device into which such a memory cell is incorporated. Exemplary properties of the electrode material can include: 1) remaining in, or otherwise maintaining, an amorphous state to control the roughness of the electrode material; 2) maintaining a stable conductivity within a desired range; 3) forming a low resistance ohmic contact with the phase change material; and 4) having a low thermal conductivity to prevent or limit thermal dissipation during programming operations (i.e. changing the phase of the phase change material). Other desirable properties can include a good mechanical adhesion with the phase change material, being chemically stable or inert with respect to the phase change material to avoid a chemical reaction therewith, and preventing or limiting the diffusion of elements through the electrode to prevent or limit undesired contamination of cell materials.

Current phase change memory cells typically employ electrodes of amorphous carbon that have been deposited by a physical vapor deposition (PVD) technique. While amorphous carbon electrodes have many desirable properties, certain properties are lacking, and thus can, in at least some cases, negatively affect the performance of the phase change memory cell. As one example, the resistivity of amorphous carbon in the thermally stable state can be too low, and is not tunable. In another example, amorphous carbon is not in a thermally stable phase following deposition. When subjected to thermal stress comparable to that applied by programming operations, a drift of bulk resistivity can be observed as a result of amorphous carbon's instability. As yet another example, the amorphous carbon/phase change memory contact interface is insufficiently ohmic, and can thus have a high contact resistance. As such, the contact resistivity can drift during cell programming cycles similar to the drift in bulk resistivity.

The aforementioned limitations and disadvantages can be overcome by the addition of one or more materials into a carbon (C) electrode. For example, adding tungsten (W) to the carbon material can beneficially affect the thermal stability of the electrode, thus reducing resistivity drift. Additionally, the inclusion of tungsten can reduce the contact resistance between the electrode and the phase change material. The resistivity of the electrode can also be tuned by adding nitrogen (N) to the CW composition. As such, an electrode material comprising CWN can provide superior performance and operation as compared to amorphous carbon electrodes.

FIG. 1, for example, shows the resistivity of two CWN materials compared with a carbon only material measured from about room temperature to about 600° C., and then back to room temperature. Electrode materials during manufacture undergo a thermal budget of approximately 400° C., depending on the materials involved and the manufacturing process. During a programming operation, a memory structure or cell into which the electrode material is incorporated undergoes fast thermal stresses with temperatures up to about 600° C., depending on the phase change material used. As such, the behavior of the electrode material between about 400° C. and about 600° C. can be considered indicative of the drift of resistivity during the operational life of the memory cell. As can be seen in FIG. 1, the resistivity of CWN materials before and after thermal stress at about 600° C. undergoes a much lower variation as compared to the carbon material. Regarding the materials noted in the legend of FIG. 1, C is the carbon material, 1090 is a material with a mix of about 10% W and 90% C, and 2080 is a material with a mix of about 20% W and 80% C.

CWN electrode materials can be made by any technique capable of forming such materials, and any such technique is considered to be within the present scope. In one example, the CWN electrode materials can be made by PVD deposition, such as by co-sputtering using C and W PVD targets in the presence of N. During the sputtering process, molecular $N_2$ can be introduced into the PVD chamber to allow N to be incorporated into the CW material. Thus, a wide variety of nearly any stoichiometry of C, W, and N can be obtained, particularly within the electrode material stability range.

As a general description of various PVD details, one design can utilize a PVD chamber that is maintained under vacuum. In some cases the PVD chamber can include two primary parts: a pedestal used to hold a substrate in position, and a source or target made from the material to be sputtered onto the substrate. The target can be made of a single element, or an alloy or mixture of elements. Thus, in the sputtering of CW electrode materials, targets used can include a C target such as graphite, a W target, and/or a CW target. An electrical power generator is generally connected between target (cathode, negative polarity) and ground.

Regarding the operation of a typical PVD process, the chamber is filled with a gas such as Ar, often kept at a low pressure (e.g. 0.1-100 mTorr). Upon activation of the power generator, some of the Ar atoms inside the chamber are ionized (Ar-->Ar+/e-) and form a plasma. The Ar+ ions, (cations) are attracted by the target, which is negatively charged, and thus move toward and impact the target surface. If the transferred energy is sufficiently high, the ionized Ar+ breaks the target material into atoms/clusters and sputters them onto the substrate surface. Depending on the properties of materials to be sputtered, the power source may be DC (direct/continuous current), DC-pulsed (a DC current with a periodic polarity inversion, for example), or RF (radio-frequency). A DC source applies a constant power to the target, and is often used sputter metals and good conductive alloys onto the substrate. A DC-pulsed source it is often used for elements/compounds that are not good electrical conductors (e.g. Carbon, chalcogenide alloys). The polarity inversion of the voltage applied by generator can be used to clear the target surface of residual electrical charges. RF sources apply a sinusoidal voltage with the typical RF frequency (e.g. 13.56 MHz). The sinusoidal fluctuation is also used to clear the target surface of residual charges. RF power sources are often used to sputter insulating materials on a substrate (e.g. oxides).

In one non-limiting example of a PVD setup that can be used to make the present CWN electrode materials, the chamber can include four targets and four generators as opposed to a single target and a single generator. It is noted, however, that any number of targets and generators capable of generating the CWN material is considered to be within the present scope. One advantage of this exemplary setup is that different materials can be used in different targets and, by selecting the appropriate powers for each generator, it is possible to "mix" different percentages of materials coming from different targets, to thus obtain a desired alloy as final film on the substrate. For example, a CW layer can be produced by sputtering from a single CW target, or by sputtering from a C target and a W target working at the same time, assuming the appropriate individual powers of linked generators. This process is referred to as "co-sputtering." Accordingly, by changing the power ratio between the C dedicated generator and the W dedicated generator, it is possible to obtain any ratio of CW in a co-sputtered material. Thus, compared to single target chambers, a wide range of compounds and compound compositions can be deposited, as opposed to a specific element/alloy. In some cases, however, there may be a low throughput (i.e. the rate of processing) compared to single target chambers. Thus PVD sputtering processes for making the present materials can utilize single target sputtering designs or multi-target co-sputtering designs, depending on the desired processing and results of a given process.

As has been described, $N_2$ can be flowed through the chamber during the sputtering process along with the Ar to facilitate the introduction of N into the CW material, thus resulting in CWN. The process is often referred to as "reactive sputtering," and the amount of N added can be dependent on the material composition being formed and on the amount of N flown inside the chamber. Thus, as the CW material is sputtered onto the substrate, $N_2$ is ionized and N is incorporated into the forming material.

Regarding the general compositional makeup of the electrode material, the relative amounts of C, W, and N in the material can vary depending on the design of the electrode and the desired physical, thermal, and electrical properties of the electrode and/or the phase change memory device. With respect to C and W, for example, in one aspect the W to C ratio can be from about 50:50 to about 1:99. In another aspect, the W to C ratio can be from about 50:50 to about 4:96. In a further aspect, the W to C ratio can be from about 30:70 to about 5:95. In yet a further aspect, the electrode can have a W to C ratio of from about 20:80 to about 10:90.

While specific ratio ranges are herein recited it is to be understood that some invention embodiments can employ nearly any specific ratio of W to C from within the stated ranges. For example, other specific W to C ratios can include, without limitation, about 5:95, about 10:90, about 15:85, about 20:80, about 25:75, about 30:70, and the like. It is noted that the W to C ratios, both in ranges and specific examples recited herein, can in some aspects be understood to be approximations of the actual ratio of materials in the electrode due to inclusion of N, among other things. It is noted that those of ordinary skill in the art would readily understand the ratios of W to C with the inclusion of N as they pertain to the above examples once in possession of the present disclosure.

Regarding the introduction or doping of the N into the electrode material, it is noted that any amount of N in the CW material that is useful in making the electrode material is considered to be within the present scope. Additionally, the N content may vary for different W to C ratios in order to achieve a desired result or performance characteristic. As variations in the N content of the material can be used to control or "tune" the resistivity of the resulting electrode material, the resulting N content can vary widely depending on the desired resistivity of the material. To simplify the testing and verification of the N content of the electrode material, ranges described herein are provided as resistivity ranges. Thus, any N amount or content that can result in a resistivity measurement within a given range is considered to be disclosed by that range, and is thus within the present scope. As one example, an electrode material of a given W to C ratio can be doped with N (i.e. an amount of N) to have a resistivity of from about 0.1 mOhm*cm to about 5 Ohm*cm. In another example, an electrode material having a given W to C ratio can be doped with N to have a resistivity of from about 0.5 mOhm*cm to about 25 mOhm*cm.

Figure 2:
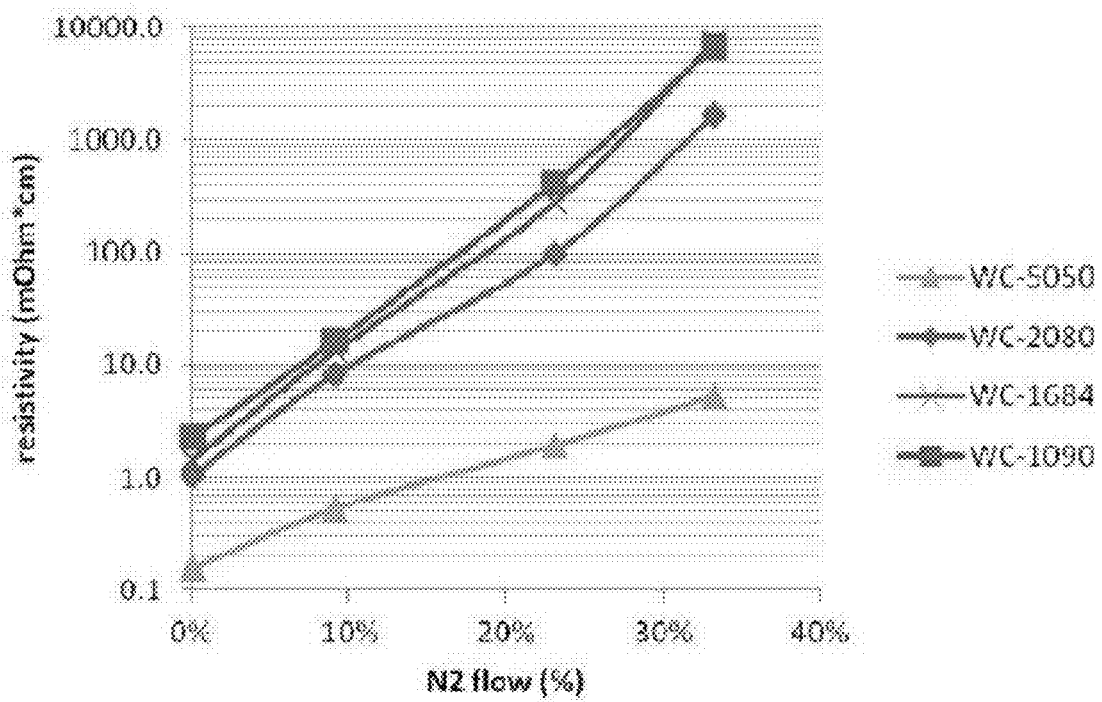
FIG. 2 is a graphical representation of data in accordance with an invention embodiment.
Figure 3:
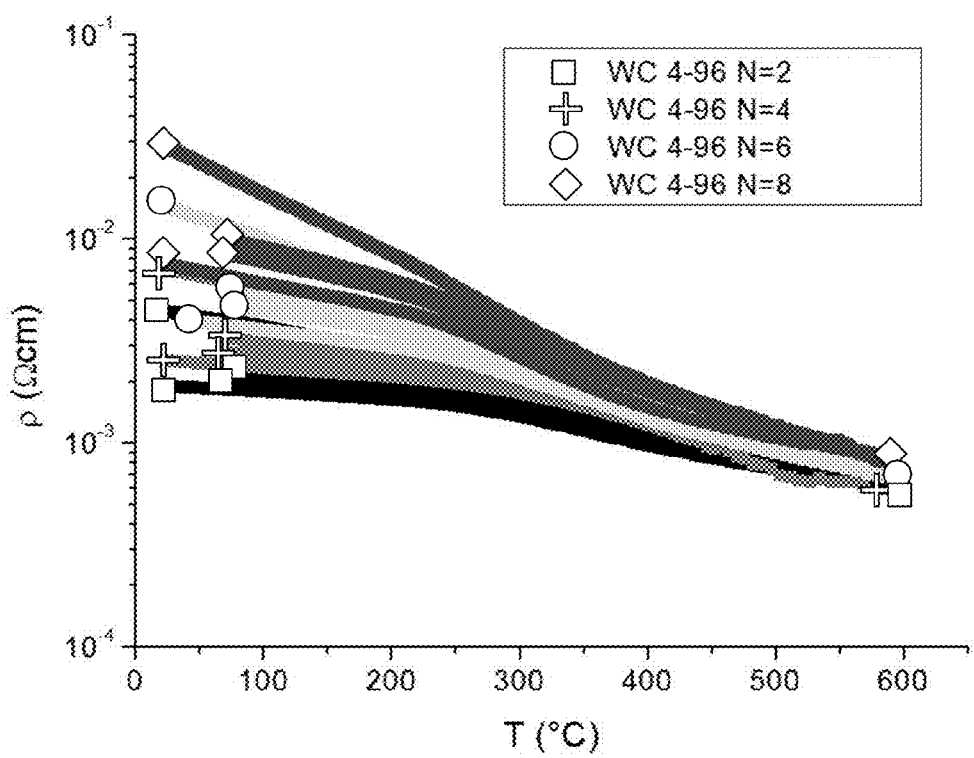
FIG. 3 is a graphical representation of data in accordance with an invention embodiment.
Figure 4:
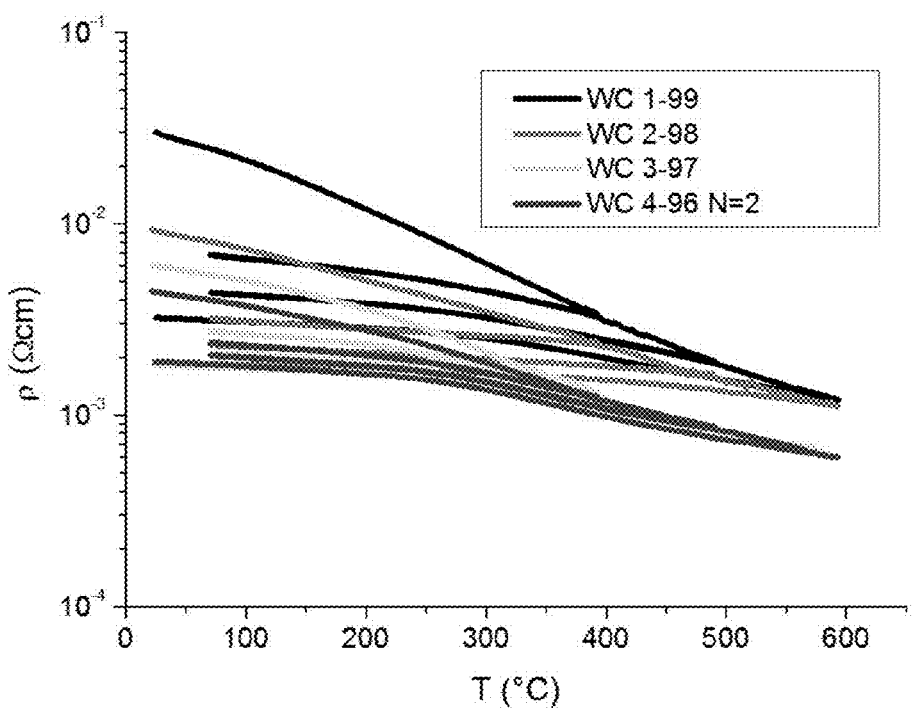
FIG. 4 is a graphical representation of data in accordance with an invention embodiment.

Additionally, the resistivity of the material can exhibit some dependence the ratio of W to C of the material, as well as the amount of $N_2$ introduced during sputtering. As is shown in FIG. 2, for example, materials having different W to C ratios exhibit different resistivities as a result of varying the $N_2$ flow during sputtering. The designations in the legend of FIG. 2 represent the W to C ratio of the material being tested. For example, WC-1684 has a W to C ratio of 16:84. A given composition of C, W, and N can thus be designed and manufactured to produce a material having specifically desired properties. As one non-limiting example, an electrode can have a W to C ratio of about 4:96 and be nitrogen doped to have a resistivity of from about 4.0 mOhm*cm to about 30.0 mOhm*cm. In another example, an electrode can have a W to C ratio of about 4:96 and be nitrogen doped to have a resistivity of from about 4.0 mOhm*cm to about 15.0 mOhm*cm. As further examples of specific electrode materials, FIG. 3 shows the resistivity of four 4:96 materials having different N doping (as shown by the $N_2$ flow rates indicated in the figure legend) as temperature is varied from about room temperature to about 600° C. and back to about room temperature. FIG. 4 shows the resistivity of four CWN materials with different W to C ratios, but having the same N doping as temperature is varied from about room temperature to about 600° C. and back to about room temperature.

As has been described, phase change memory devices, structures, cells, electrodes, and the like are herein disclosed. In one aspect, a phase change memory structure can include a phase change material and an electrode forming an ohmic contact with the phase change material. The electrode, as has been described, can include C, W, and N. In one example, the ohmic contact can be mechanically and thermally stable across a temperature range of from about 20° C. to about 600° C.

Furthermore, electrodes having the material CWN as described can in some embodiments form a diffusion barrier against the contamination of the phase change material, thus increasing the extended performance of a memory device. Additionally, the electrode can have a drift of bulk resistivity that is less than about 10 mOhm*cm for the 4:96 material with 8 sccm $N_2$ doping during thermal stress from a programming operation.

The phase change material can include any useful material having a detectable change in phase. Examples of such a materials include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_yTe_z$ having variations in stoichiometries, such as $Ge_2Sb_2Te_5$, $Ge_2Sb_2Te_7$, $Ge_1Sb_2Te_4$, $Ge_1Sb_4Te_7$, etc., to form a gradient.

In another aspect, a phase change memory structure or cell is provided, including a stack structure having a first electrode, a second electrode, and a phase change material disposed between the first electrode and the second electrode. Additionally, at least one of the first or second electrodes can form an ohmic contact with the phase change material, and the at least one of the first or second electrodes is a CWN electrode. The memory cell can further include a third electrode and a select device material disposed between the third electrode and the second electrode. In a further example, both the first and second electrodes form ohmic contacts with the phase change material, and the first and second electrodes are made of a CWN material. In yet another example, the first, second, and third electrodes form ohmic contacts with the phase change material, and all of the first, second, and third electrode are made of a CWN material.

Figure 5A:
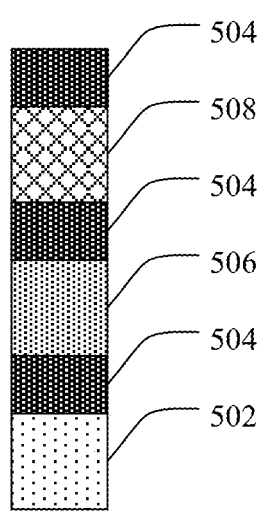
FIG. 5A is a schematic view of a phase change memory cell in accordance with an invention embodiment.
Figure 5B:
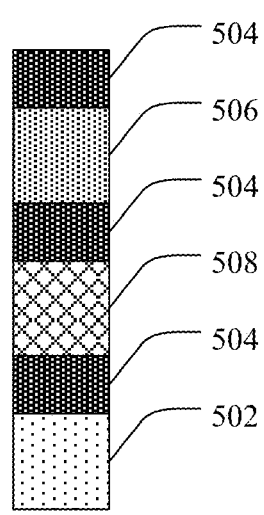
FIG. 5B is a schematic view of a phase change memory cell in accordance with an invention embodiment.

FIG. 5A shows one exemplary phase change memory cell or structure configuration. The memory cell can include a word line 502 or other structure whereby the memory cell is incorporated into a memory device. Additionally, the memory cell includes a select device material 506 and a phase change material 508, where each of the word line 502, the select device material 506, and the phase change material 508 are separated by an electrode material 504. In an alternative arrangement, as is shown in FIG. 5B, the order of the select device material 506 and the phase change material 508 can be reversed. The stack arrangements shown in FIGS. 5A and B can thus reduce the total stack resistance and the resistivity drift during programming cycles.

In another example, an electrode for use in a phase change memory structure is provided. Such an electrode can include an electrode material capable of forming an ohmic contact with a phase change material, where the electrode material is made of a CWN material.

In yet another example, a method of forming a phase change memory structure is provided. Such a method can include forming a first, second, and third electrode with a phase change material disposed between the first and second electrode and a select device material disposed between the second and third electrode, where at least one of the first or second electrodes is formed by co-sputtering carbon and tungsten in a nitrogen gas environment at a partial pressure sufficient to nitrogen dope the carbon-tungsten electrode. In another example, the first and second electrode are formed by co-sputtering carbon and tungsten in a nitrogen gas environment at a partial pressure sufficient to nitrogen dope the carbon-tungsten electrode. In yet another example, the third electrode is additionally formed by co-sputtering carbon and tungsten in a nitrogen gas environment at a partial pressure sufficient to nitrogen dope the carbon-tungsten electrode. While nitrogen flow rates can vary, as has been described herein, in one example the nitrogen gas can be flowed at a rate of from about 2 sccm to about 10 sccm during co-sputtering to facilitate nitrogen doping.

Figure 6:
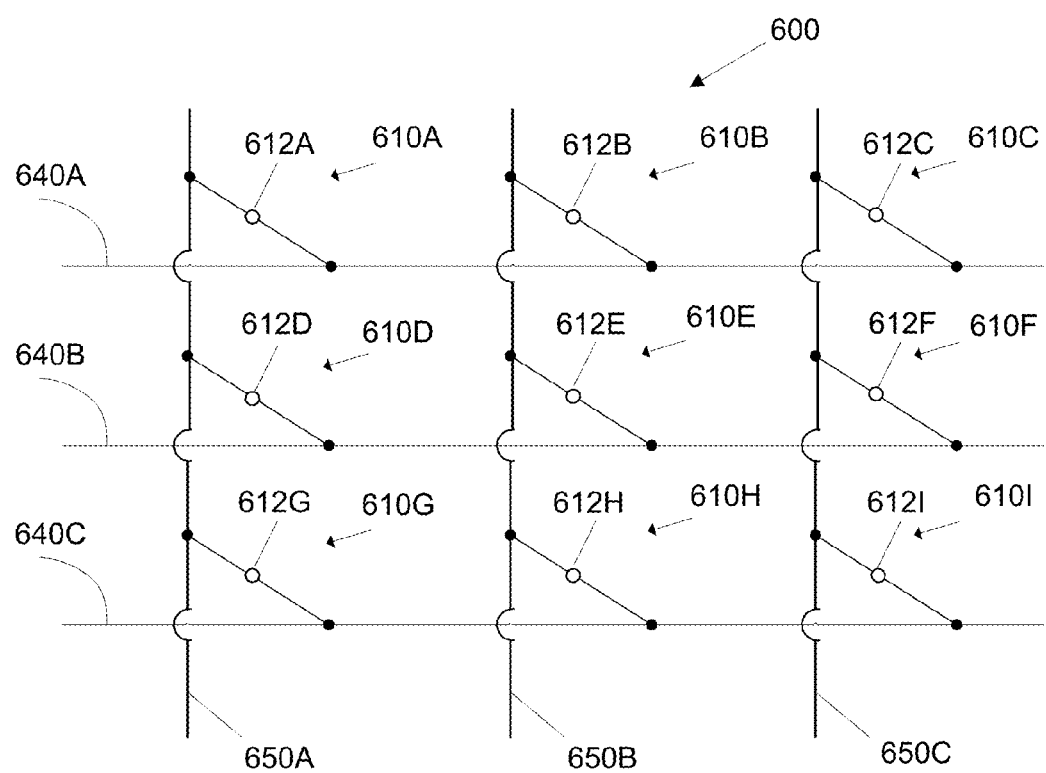
FIG. 6 shows a schematic view of an embodiment of a phase change memory array or system that includes phase change memory cells in accordance with an invention embodiment.

FIG. 6 shows a schematic view of an embodiment of a phase change memory array 600 or system. The array includes, for illustration purposes, a 3×3 array of memory cells 610A-610I. Each memory cell (610A-610I) may include a phase change material or element, along with any other typical materials or structures required of a phase change memory cell. In one embodiment, one or more, or all, of the phase change cells can include the materials and structures depicted in FIGS. 5A or 5B, or a portion thereof. The memory array 600 may include column lines 650A-C and row lines 640A-C to select a particular memory cell of the array or system during a write or read operation. The column lines 650A-C and the row lines 640A-C may also be referred to as "address lines" since these lines may be used to address memory cells 610A-I during programming or reading. The column lines 650A-C may also be referred to as "bit lines", and the row lines 640A-C may also be referred to as "word lines". Further, it is understood that the 3×3 array of FIG. 6 is merely exemplary and may be any appropriate size (i.e. any number of memory cells).

The phase change memory elements 612A-I may be connected to the column lines 650A-C and may be coupled to the row lines 640A-C. Switches such as ovonic switches as well as capacitors, junctions, or other features or structures (not shown) as desired may be used in the memory array or system 600. Operation of the memory array or system 600 proceeds according to standard operation for such a phase change memory device, by application of current through column and row lines, etc.

EXAMPLE

The following PVD process can be utilized to generate CWN electrodes. A co-sputter chamber is configured with 3 targets (6 mm thick, Cu alloy backing plate, 150 mm diameter):

Target 1: pure carbon 100%
Target 2: pure carbon 100%
Target 3: mixed material with uniform composition Tungsten 20% Carbon 80%

During deposition, an argon flow of 20 sccm (standard cube centimeter per minute) is set in order to maintain a constant argon partial pressure of 0.5 mTorr. An additional $N_2$ flow is set to establish the $N_2$ partial pressure needed for nitrogen doping. With the MFC (mass flow controller) installed on the equipment, the $N_2$ flow can be varied from 2 sccm to 10 sccm.

With this hardware configuration, a WCN film can be deposited with W:C ratio varying from 0 to 0.2. The desired $N_2$ flow was set on the basis of resulting film resistivity. With the available flow range, resistivity was varied from 0.5 mOhm*cm to 25 mOhm*cm.

With different target materials it is possible to explore a wider compositional range: for instance, by using one or more pure W targets together with one or more C targets, it is possible to explore any WxCy composition with both x and y varying continuously from 0 to 1. By using a wider gauge (mass flow controller) for Nitrogen, it is also possible to increase the N content in the film.

Many films were characterized to obtain the desired resistivity. Two exemplary process set-ups are as follows:
W/C ratio=4/96, N2 flow=4 sccm with resistivity=5.4 mOhm*cm
W/C ratio=4/96, N2 flow=6 sccm with resistivity=12.4 mOhm*cm Generators' sputtering powers are tuned to create the desired compositions. Their values depend on the maximum powers that targets can sustain without being damaged by overheating. Typical maximum powers for metallic or Carbon-based PVD targets is 1500 W.

In an exemplary invention embodiment, a phase change memory structure is provided having a phase change material of a memory cell, and an electrode forming an Ohmic contact with the phase change material, the electrode comprising tungsten and carbon and being doped with nitrogen.

In one example, the phase change memory structure may have an Ohmic contact that is mechanically and thermally stable across a temperature range of from about 20° C. to about 600° C.

In on example, the electrode forms a diffusion barrier against contamination of the phase change material.

In one example, the electrode has a tungsten to carbon ratio of from about 50:50 to about 1:99.

In one example, the electrode has a tungsten to carbon ratio of from about 50:50 to about 4:96.

In one example, the electrode has a tungsten to carbon ratio of from about 30:70 to about 5:95.

In one example, the electrode has a tungsten to carbon ratio of from about 20:80 to about 10:90.

In one example, the electrode is nitrogen doped to have a resistivity of from about 0.1 mOhm*cm to about 5 Ohm*cm.

In one example, the electrode is nitrogen doped to have a resistivity of from about 0.5 mOhm*cm to about 25 mOhm*cm.

In one example, the electrode has a tungsten to carbon ratio of about 4:96 and is further nitrogen doped to have a resistivity of from about 4.0 mOhm*cm to about 30.0 mOhm*cm.

In an exemplary invention embodiment, a performance-enhanced phase change memory cell is provided having: a stack structure including, a first electrode, a second electrode, a phase change material disposed between the first electrode and the second electrode, wherein at least one of the first or second electrodes forms an Ohmic contact with the phase change material, the at least one of the first or second electrodes comprises tungsten and carbon and is doped with nitrogen; a third electrode; and a select device material disposed between the third electrode and the second electrode.

In one example, both the first and second electrodes form Ohmic contacts with the phase change material, the first and second electrodes comprising tungsten and carbon and being doped with nitrogen.

In one example, the second and third electrodes form Ohmic contacts with the phase change material, the third electrode comprises tungsten and carbon and is doped with nitrogen.

In one example, the electrode is nitrogen doped to an extent providing a resistivity of from about 0.1 mOhm*cm to about 5 Ohm*cm.

In one example, at least one of the first or second electrodes is nitrogen doped to have a resistivity of from about 0.5 mOhm*cm to about 25 mOhm*cm.

In one example, at least one of the first or second electrodes has a tungsten to carbon ratio of about 4:96 and is further nitrogen doped to have a resistivity of from about 4.0 mOhm*cm to about 15.0 mOhm*cm.

In an additional exemplary invention embodiment, a method of forming a phase change memory structure is provided and can include forming a first, second, and third electrode with a phase change material disposed between the first and second electrode and a select device material disposed between the second and third electrode, wherein at least one of the first or second electrodes comprises a tungsten and carbon material doped with nitrogen.

In one example, at least one of the first or second electrodes is formed by co-sputtering carbon and tungsten in a nitrogen gas environment at a partial pressure sufficient to nitrogen dope the carbon-tungsten electrode.

In one example, both the first and second electrodes comprise a tungsten and carbon material doped with nitrogen, or wherein one of the first and second electrodes comprise a tungsten and carbon material doped with nitrogen and the third electrode comprises a tungsten and carbon material doped with nitrogen, or wherein all three electrodes comprise a tungsten and carbon material doped with nitrogen.

In one example, the electrodes comprising a tungsten and carbon material doped with nitrogen are formed by co-sputtering carbon and tungsten in a nitrogen gas environment at a partial pressure sufficient to nitrogen dope the carbon-tungsten electrode.

In one example, nitrogen gas is flowed at a rate of from about 2 sccm to about 10 sccm during co-sputtering to facilitate nitrogen doping.

While the forgoing examples are illustrative of the specific embodiments in one or more particular applications, it will be apparent to those of ordinary skill in the art that numerous modifications in form, usage and details of implementation can be made without departing from the principles and concepts articulated herein. Accordingly, no limitation is intended except as by the claims set forth below.

What is claimed is:

1. A phase change memory structure, comprising:
    a phase change material of a memory cell; and
    an electrode forming an Ohmic contact with the phase change material, the electrode comprising a carbon tungsten nitrogen material (CWN) formed by co-sputtering carbon and tungsten under nitrogen flowing at a rate from about 2 sccm to about 10 sccm, wherein the electrode has a tungsten to carbon at % ratio of from about 20:80 to about 4:96.

2. The memory structure of claim 1, wherein the electrode forms a diffusion barrier against contamination of the phase change material.

3. The memory structure of claim 1, wherein the electrode has a tungsten to carbon at % ratio of from about 20:80 to about 5:95.

4. The memory structure of claim 1, wherein the electrode has a tungsten to carbon at % ratio of from about 20:80 to about 10:90.

5. The memory structure of claim 1, wherein the electrode is nitrogen doped to have a resistivity of from about 0.1 mOhm*cm to about 5 Ohm*cm.

6. The memory structure of claim 1, wherein the electrode is nitrogen doped to have a resistivity of from about 0.5 mOhm*cm to about 25 mOhm*cm.

7. The memory structure of claim 1, wherein the electrode has a tungsten to carbon at % ratio of about 4:96 and is further nitrogen doped to have a resistivity of from about 4.0 mOhm*cm to about 30.0 mOhm*cm.

8. A performance-enhanced phase change memory cell, comprising:
    a stack structure including:
        a first electrode;
        a second electrode;
        a phase change material disposed between the first electrode and the second electrode, wherein at least one of the first or second electrodes forms an Ohmic contact with the phase change material, the at least one of the first or second electrodes comprises a carbon tungsten nitride material (CWN) formed by co-sputtering carbon and tungsten under nitrogen flowing at a rate from about 2 sccm to about 10 sccm, and the at least one of the first or second electrodes has a tungsten to carbon at % ratio of from about 20:80 to about 4:96;
        a third electrode; and
        a select device material disposed between the third electrode and the second electrode.

9. The memory cell of claim 8, wherein both the first and second electrodes form Ohmic contacts with the phase change material, the first and second electrodes comprising tungsten and carbon and being doped with nitrogen.

10. The memory cell of claim 8, wherein the second and third electrodes form Ohmic contacts with the phase change material, the third electrode comprises tungsten and carbon and is doped with nitrogen.

11. The memory cell of claim 8, wherein at least one of the first or second electrodes is nitrogen doped to an extent providing a resistivity of from about 0.1 mOhm*cm to about 5 Ohm*cm.

12. The memory cell of claim 8, wherein at least one of the first or second electrodes is nitrogen doped to have a resistivity of from about 0.5 mOhm*cm to about 25mOhm*cm.

13. The memory cell of claim 8, wherein at least one of the first or second electrodes has a tungsten to carbon at % ratio of about 4:96 and is further nitrogen doped to have a resistivity of from about 4.0 mOhm*cm to about 15.0 mOhm*cm.

14. The memory cell of claim 8, wherein the select device material is a phase change material.

15. The memory structure of claim 1, wherein the electrode has a tungsten to carbon at % ratio of 4:96 and the nitrogen is flowed at a rate of 8 sccm.

* * * * *